(12) United States Patent
Wang et al.

(10) Patent No.: US 11,442,100 B2
(45) Date of Patent: Sep. 13, 2022

(54) SIGNAL DETECTION AND MONITORING

(71) Applicant: INTERNATIONAL BUSINESS MACHINES CORPORATION, Armonk, NY (US)

(72) Inventors: Rui W W Wang, Beijing (CN); Jing Wen Xu, Beijing (CN); Zi Jian Ji, Beijing (CN); He Li, Beijing (CN); Ya Dong Li, Beijing (CN); Jian Zhang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 16/949,393

(22) Filed: Oct. 28, 2020

(65) Prior Publication Data

US 2022/0128619 A1 Apr. 28, 2022

(51) Int. Cl.
*G01R 31/28* (2006.01)
*G06F 11/22* (2006.01)
*G01R 25/00* (2006.01)

(52) U.S. Cl.
CPC ....... *G01R 31/2846* (2013.01); *G01R 25/005* (2013.01); *G06F 11/2289* (2013.01)

(58) Field of Classification Search
CPC ...... G01R 31/28; G01R 31/00; G01R 25/005; G01R 25/00; G06F 11/2289; G06F 11/22; G06F 11/00
See application file for complete search history.

(56) References Cited

U.S. PATENT DOCUMENTS

| 7,801,258 | B2 | 9/2010 | Narus |
| 8,089,349 | B2 | 1/2012 | Tognola |
| 2019/0165766 | A1 | 5/2019 | Farr |
| 2021/0172992 | A1* | 6/2021 | Wakabayashi ......... G01R 31/12 |
| 2022/0100939 | A1* | 3/2022 | Mishra ................. G06F 30/392 |

FOREIGN PATENT DOCUMENTS

| EP | 0526973 B1 | 2/1993 |
| EP | 1241983 B1 | 9/2002 |
| FR | 2808594 A1 | 11/2001 |

OTHER PUBLICATIONS

Mell, Peter et al.; "The NIST Definition of Cloud Computing;" National Institute of Standards and Technology; Special Publication 800-145; Sep. 2011; 7 pages.

(Continued)

*Primary Examiner* — Mohamed Charioui
(74) *Attorney, Agent, or Firm* — Schmeiser, Olsen & Watts; Christopher M. Pignato

(57) ABSTRACT

A method, system, and computer program product for detecting and monitoring a signal is provided. The method includes detecting an alignment point for a periodic signal segment of a periodic signal generated by an apparatus being monitored for standard functionality In response, the apparatus is activated from a period prior to the alignment point to an end point of the periodic signal segment and a first point of the periodic signal segment is located. Likewise, a second point of an additional periodic signal segment of the periodic signal is located. The periodic signal is normalized based on results of locating the first point and the second point.

14 Claims, 8 Drawing Sheets

(56) References Cited

OTHER PUBLICATIONS

Ahrens, Lia et al.; A machine-learning phase classification scheme for anomaly detection in signals with periodic characteristics; EURASIP journal on Advances in Signal Processing; 2019; 23 pages.

Gharghabi, Shaghayegh et al.; Domain agnostic online semantic segmentation for multi-dimensional time series; Data Mining and Knowledge Discovery; Sep. 2018; pp. 96-130.

Jarne, Cecilia et al.; A method to align time series segments based on envelope features as anchor points; Engineering, Computer Science; Dec. 2018; 7 pages.

Vlachos, Michail et al.; On Periodicity Detection and Structural Periodic Similarity; SDM; 2005; 12 pages.

Combined Search and Examination Report under Sections 17 and 18(3); dated Jun. 20, 2022; Application No. GB21142930.0; 11 pages.

\* cited by examiner

SIGNAL DETECTION AND MONITORING

BACKGROUND

The present invention relates generally to a method for monitoring and detecting an electrical signal and in particular to a method and associated system for improving hardware and software technology associated with detecting, evaluating, and normalizing periodic electrical signals of an apparatus for detecting and repairing potential hardware and software issues associated with operating the apparatus.

SUMMARY

A first aspect of the invention provides a signal detection and monitoring method comprising: detecting, by a processor of a hardware device, an alignment point for a periodic signal segment of a periodic signal generated by an apparatus being monitored for standard functionality; activating, by the processor in response results of the detecting, the apparatus from a period prior to the alignment point to an end point of the periodic signal segment; first locating, by the processor, a first point of the periodic signal segment; second locating, by the processor, a second point of an additional periodic signal segment of the periodic signal, wherein the second point comprises a same point as the first point, wherein the first locating and the second locating comprise: determining a lowest point of the periodic signal segment; determining a difference feature between the first point of the periodic signal segment and the second point of the additional periodic signal segment; determining a relative minimum angle between the first point of the periodic signal segment and the second point of the additional periodic signal segment; and analyzing the lowest point with respect to the difference feature and the relative minimum angle; and normalizing, by the processor in response to results of the first locating and the second locating, the periodic signal.

A second aspect of the invention provides a computer program product, comprising a computer readable hardware storage device storing a computer readable program code, the computer readable program code comprising an algorithm that when executed by a processor of a hardware device implements a signal detection and monitoring method, the method comprising: detecting, by the processor, an alignment point for a periodic signal segment of a periodic signal generated by an apparatus being monitored for standard functionality; activating, by the processor in response results of the detecting, the apparatus from a period prior to the alignment point to an end point of the periodic signal segment; first locating, by the processor, a first point of the periodic signal segment; second locating, by the processor, a second point of an additional periodic signal segment of the periodic signal, wherein the second point comprises a same point as the first point, wherein the first locating and the second locating comprise: determining a lowest point of the periodic signal segment; determining a difference feature between the first point of the periodic signal segment and the second point of the additional periodic signal segment; determining a relative minimum angle between the first point of the periodic signal segment and the second point of the additional periodic signal segment; and analyzing the lowest point with respect to the difference feature and the relative minimum angle; and normalizing, by the processor in response to results of the first locating and the second locating, the periodic signal.

A third aspect of the invention provides a hardware device comprising a processor coupled to a computer-readable memory unit, the memory unit comprising instructions that when executed by the processor implements a signal detection and monitoring method comprising: detecting, by the processor, an alignment point for a periodic signal segment of a periodic signal generated by an apparatus being monitored for standard functionality; activating, by the processor in response results of the detecting, the apparatus from a period prior to the alignment point to an end point of the periodic signal segment; first locating, by the processor, a first point of the periodic signal segment; second locating, by the processor, a second point of an additional periodic signal segment of the periodic signal, wherein the second point comprises a same point as the first point, wherein the first locating and the second locating comprise: determining a lowest point of the periodic signal segment; determining a difference feature between the first point of the periodic signal segment and the second point of the additional periodic signal segment; determining a relative minimum angle between the first point of the periodic signal segment and the second point of the additional periodic signal segment; and analyzing the lowest point with respect to the difference feature and the relative minimum angle; and normalizing, by the processor in response to results of the first locating and the second locating, the periodic signal.

The present invention advantageously provides a simple method and associated system capable of accurately monitoring, detecting, and evaluating an electrical signal.

DETAILED DESCRIPTION

Figure 1:
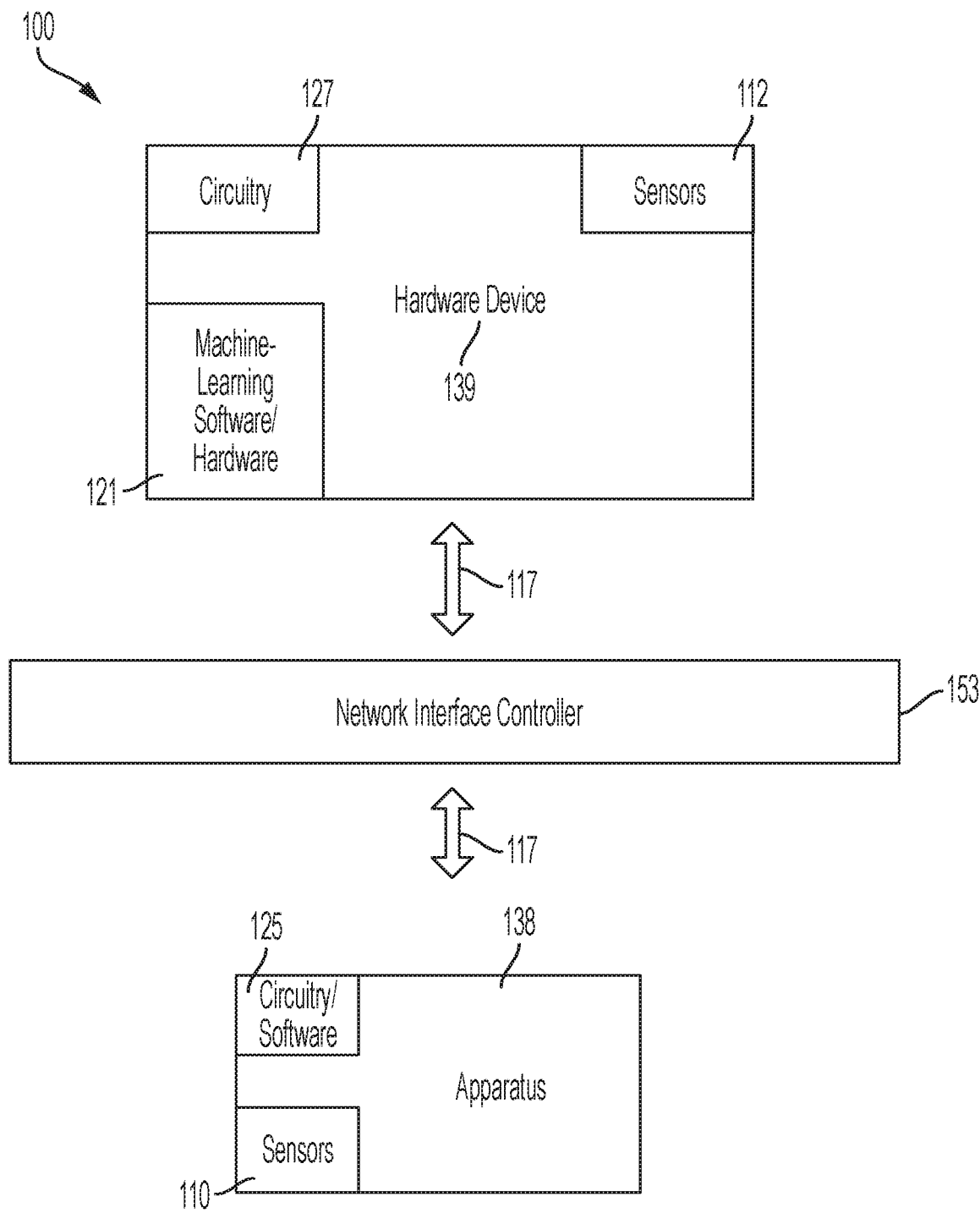
FIG. 1 illustrates a system for improving hardware and software technology associated with detecting, evaluating, and normalizing periodic electrical signals of an apparatus for detecting and repairing potential hardware and software issues associated with operating the apparatus, in accordance with embodiments of the present invention.

FIG. 1 illustrates a system 100 for improving hardware and software technology associated with detecting, evaluating, and normalizing periodic electrical signals of an apparatus 138 for detecting and repairing potential hardware and software issues associated with operating the apparatus 138, in accordance with embodiments of the present invention. Typical device operation results in the generation of periodic signals. Hidden rules in the periodic signals may be analyzed for monitoring a health status of the apparatus. Examples of periodic signals may include, inter alia, a periodic pressure value of a water pump, a periodic sound or vibration signal of an engine and/or a periodic distance signal of gear engagement, etc. For example, a periodic pressure value of a water pump may be used to judge a running state of the water pump. Likewise, periodic infrared monitoring data of an engine may be used to monitor a health state of the engine. However, when periodic signals are sliced for analysis (for real-time acquisition), a same signal may present different characteristics with in different periodic segments (due to different cut-off points). Therefore, system 100 is configured to enable a process for normalizing periodic signal segments enable an apparatus to identify different signals. Intelligent classification (normal or abnormal) of the signals enable quick detection for predicting apparatus defects. A typical process for determining if a periodic signal is normal or abnormal may comprise a binary classification process that includes modeling a normal signal with respect to training data such that a testing signal conforming to the modeling pattern is determined to be normal. During a real-time monitoring process, periodic signals are cut into segments with respect to a cycle and each signal segment is compared with a standard normal signal. If a match is located, an associated segment may be regarded as a normal signal. However, when signal segments are compared with a standard signal, each signal segment may be cut at different periodic points thereby leading to mismatches due to a misalignment of a cut point. Therefore, system 100 is configured to normalize signals within different periods to eliminate mismatches caused by cut point dislocation.

System 100 enables a normalization process with respect to modifying a periodic signal. The process includes locating a lowest point for each periodic signal segment and rotating a component of an apparatus (e.g., a pump motor) for a period occurring from prior to the lowest point until the end of the periodic signal segment thereby causing a same type of periodic signal to be associated with a same characteristic comprising the same starting point. Additionally (with respect to a complex signal), a difference feature and a minimum relative angle feature may be determined to locate a lowest point for each periodic signal segment thereby improving an accuracy of machine recognition.

During a process for segmenting a periodic signal, signal segments within different periods may be associated with different characteristics due to differing starting points. Therefore, system 100 enables a normalization process for enabling signal segments located within a same period to present similar characteristics via splicing despite differing starting segmenting points. The normalization process is initiated when a same segmenting point within a signal segment is located. Subsequently, a first half of the segmenting point is rotated and spliced to a second half of the signal segment. Locating a same segmenting point may comprise locating a lowest point of a signal within one cycle. Alternatively, locating a same segmenting point may comprise locating a difference feature and a relative minimum angle. A difference feature is defined herein as a difference between a lowest point and an associated previous sample point and a difference between the lowest point and a next sample point. A difference feature represents a change in amplitude of the signal so that a difference feature may distinguish differing low points. If the amplitude of multiple low points comprises a same amplitude, a relative minimum angle may be used to locate a same segmenting point. A relative minimum angle is defined herein as an angle located between a line connecting a lowest point and a highest point (within one cycle) and a horizontal line. The relative minimum angle analyzes a difference and distance between the lowest point and the highest point for accurately locating a lowest point more accurately.

System 100 of FIG. 1 includes a hardware device 139 (i.e., specialized hardware), an apparatus 138, and a network interface controller 153 interconnected through a network 117. Hardware device 139 includes specialized circuitry 127 (that may include specialized software), sensors 112, and machine learning software code/hardware structure 121 (i.e., including machine learning software code). Interface controller 153 may include any type of device or apparatus for securely interfacing hardware and software to a network. Apparatus 138 comprises any type of hardware or software device requiring monitoring (for operation) and may include, inter alia, an engine, a water pump, a device comprising gears, etc. Apparatus 138 may be Bluetooth enabled to provide connectivity to each other and any type of system. Apparatus 138 includes specialized circuitry 125 (that may include specialized software/service) and sensors 110. Sensors 110 and 112 may include any type of internal or external sensor including, inter alia, ultrasonic three-dimensional sensor modules, a temperature sensor, an ultrasonic sensor, an optical sensor, a video retrieval device, an audio retrieval device, humidity sensors, voltage sensors, pressure sensors, etc. Hardware device 139 and apparatus 138 each may comprise an embedded device. An embedded device is defined herein as a dedicated device or computer comprising a combination of computer hardware and software (fixed in capability or programmable) specifically designed for executing a specialized function. Programmable embedded computers or devices may comprise specialized programming interfaces. In one embodiment, hardware device 139 and apparatus 138 may each comprise a specialized hardware device comprising specialized (non-generic) hardware and circuitry (i.e., specialized discrete non-generic analog, digital, and logic-based circuitry) for (independently or in combination) executing a process described with respect to FIGS. 1-8. The specialized discrete non-generic analog, digital, and logic-based circuitry may include proprietary specially designed components (e.g., a specialized integrated circuit, such as for example an Application Specific Integrated Circuit (ASIC) designed for only implementing an automated process for improving hardware and software technology associated with detecting, evaluating, and normalizing periodic electrical signals of an apparatus 138 for detecting and repairing potential hardware and software issues associated with operating the apparatus 138. Network 117 may include any type of network including, inter alia, a 5G telecom network, a local area network, (LAN), a wide area network (WAN), the Internet, a wireless network, etc. Alternatively, network 117 may include an application programming interface (API).

System 100 is enabled to align periodic signal segments prior to matching associated low points of the signal thereby reducing inefficiencies with respect to machine recognition. The alignment process includes locating a unified segmenting point within differing periodic segments and rotating an associated portion occurring prior to a cutting point extending to an end of the signal segment. A uniform alignment point is determined such that periodic segments comprise similar characteristics for detecting anomalies with an apparatus.

Figure 2:
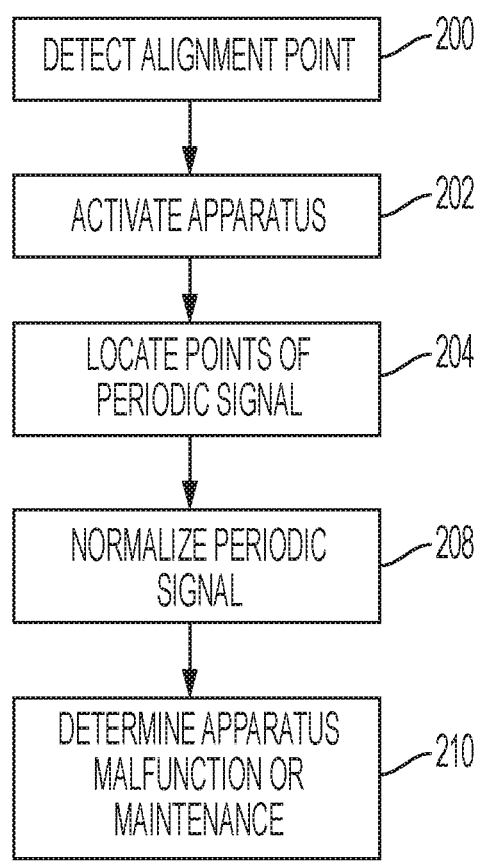
FIG. 2 illustrates an algorithm detailing a process flow enabled by the system of FIG. 1 for improving hardware and software technology associated with detecting, evaluating, and normalizing periodic electrical signals of an apparatus for detecting and repairing potential hardware and software issues associated with operating the apparatus, in accordance with embodiments of the present invention.

FIG. 2 illustrates an algorithm detailing a process flow enabled by system 100 of FIG. 1 for improving hardware and software technology associated with detecting, evaluating, and normalizing periodic electrical signals of an apparatus for detecting and repairing potential hardware and software issues associated with operating the apparatus, in accordance with embodiments of the present invention. Each of the steps in the algorithm of FIG. 2 may be enabled and executed in any order by a computer processor(s) executing computer code. Additionally, each of the steps in the algorithm of FIG. 2 may be enabled and executed in combination by hardware device 139 and apparatus 138. In step 200, an alignment point for a periodic signal segment of a periodic signal is detected. The periodic signal is generated by an apparatus being monitored for standard functionality. In step 202, the apparatus is activated (in response to results of step 200) from a period prior to the alignment point to an end point of the periodic signal segment. Activating the apparatus may include rotating a portion of the apparatus from the period prior to the alignment point to the end point of the periodic signal segment.

In step 204, a first point of the periodic signal segment is located. Additionally, a second point of an additional periodic signal segment of the periodic signal is located. The second point comprises a same point as the first point. The first point and the second point may each include, inter alia, a unique (previously selected) cutting point, a uniform alignment point, etc.

Locating the first and second points may include:
1. Determining a lowest point of the periodic signal segment.
2. Determining a difference feature between the first point of the periodic signal segment and the second point of the additional periodic signal segment. Determining the difference feature may include: determining a first difference between the lowest point and a previously retrieved sample point of the periodic signal segment; and determining a second difference between the lowest point and a next sample point of the of said periodic signal segment. Determining the first difference and the second difference may indicate a change in amplitude of the periodic signal.
3. Determining a relative minimum angle between the first point of the periodic signal segment and the second point of the additional periodic signal segment. The relative minimum angle includes an angle located between a line connecting the lowest point and a highest point of the periodic signal segment and a horizontal line.
4. Analyzing the lowest point with respect to the difference feature and the relative minimum angle.

In step 208, The periodic signal is normalized in response to results of locating the first point and the second point. In step 210, it is determined (based on results of step 204) the apparatus is malfunctioning or requires (hardware and/or software) maintenance.

Figure 3:
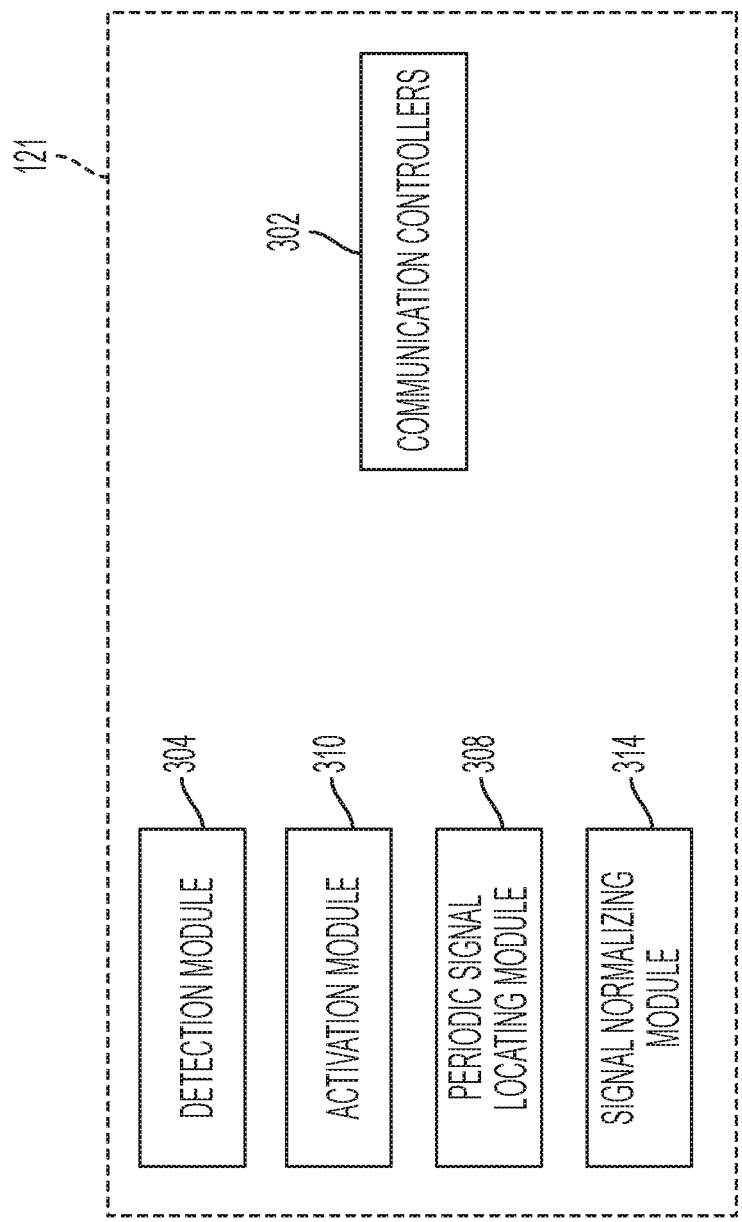
FIG. 3 illustrates an internal structural view of the machine learning software/hardware structure and/or the circuitry/software of FIG. 1, in accordance with embodiments of the present invention.

FIG. 3 illustrates an internal structural view of machine learning software/hardware structure 121 (and/or circuitry 127) of FIG. 1, in accordance with embodiments of the present invention. Machine learning software/hardware structure 121 includes a detection module 304, an activation module 310, a periodic signal locating module 308, a signal normalizing module 314, and communication controllers 302. Detection module 304 comprises specialized hardware and software for controlling all functions related to the alignment point detections steps of FIGS. 1 and 2. Activation module 310 comprises specialized hardware and software for controlling all functionality related control of apparatus activation functionality for implementing the process described with respect to the algorithm of FIG. 2. Periodic signal locating module 308 comprises specialized hardware and software for controlling all functions related to the periodic signal locating steps of FIG. 2. Signal normalizing module 314 comprises specialized hardware and software for controlling all functions related to normalizing periodic signals as described, supra. Communication controllers 302 are enabled for controlling all communications between detection module 304, activation module 310, periodic signal locating module 308, and signal normalizing module 314.

Figure 4:
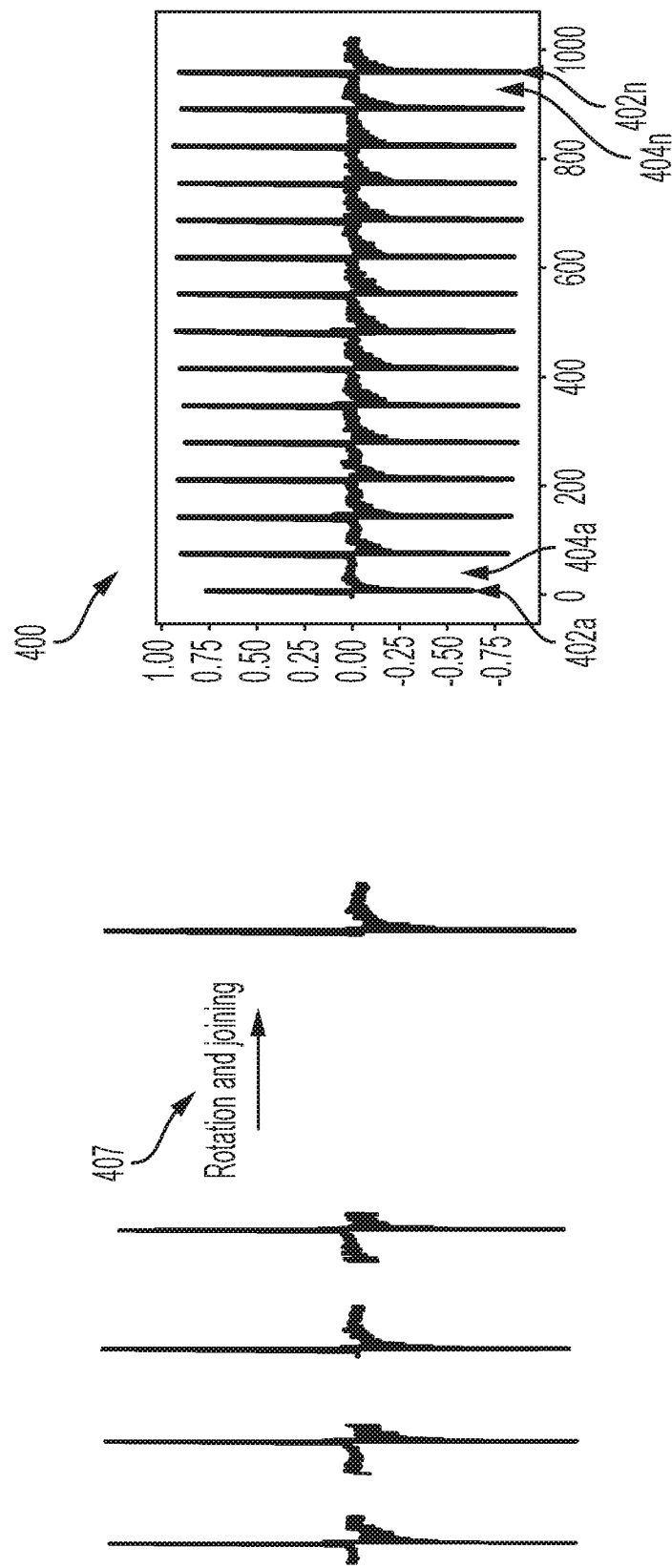
FIG. 4 illustrates a signal rotation and joining process for implementing a signal normalization process, in accordance with embodiments of the present invention.

FIG. 4 illustrates a signal rotation and joining process for implementing a signal normalization process, in accordance with embodiments of the present invention. A normalization process associated with a periodic signal 400 (associated with a device) is executed to locate a lowest point 402a . . . 402n of each periodic signal segment 404a . . . 404n and subsequently rotate 407 a portion the device from prior to a low point to the end of an associated periodic signal segment such that a same type of periodic signal comprises same characteristics due to an association with a same starting point. Additionally (with respect to complex signal) a difference feature and a minimum relative angle feature may be determined to locate a lowest point 402a . . . 402n of each periodic signal segment 404a . . . 404n as described, infra, with respect to FIG. 5.

Figure 5:
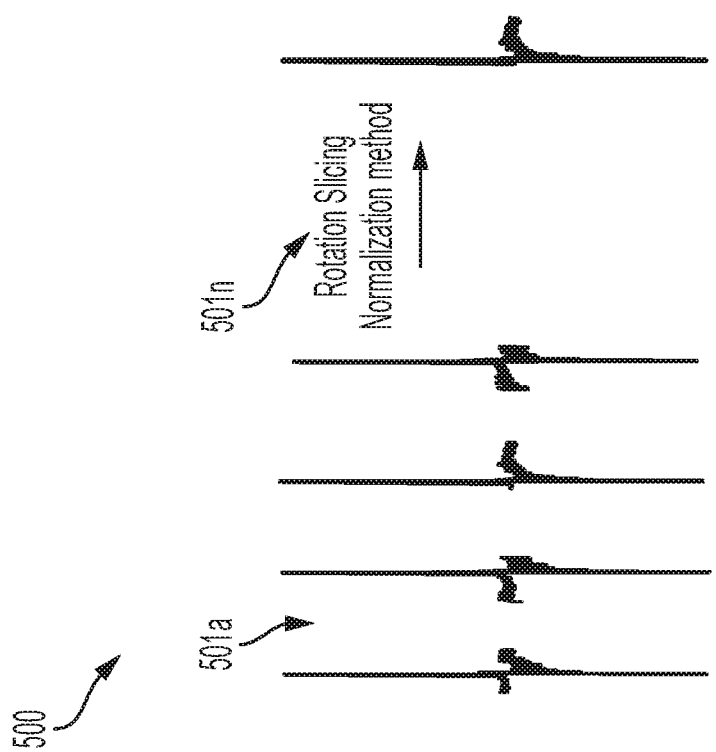
FIG. 5 illustrates an end point alignment process for implementing a signal normalization process, in accordance with embodiments of the present invention.
Figure 5:
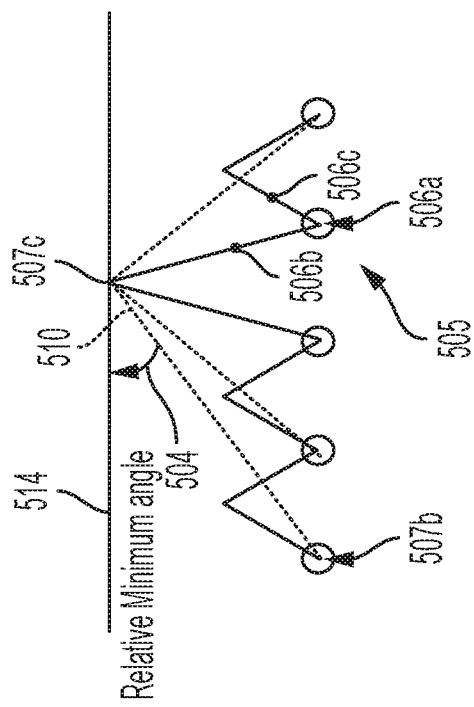

FIG. 5 illustrates an end point alignment process for implementing a signal normalization process, in accordance with embodiments of the present invention. The end point alignment process is executed for enabling system 100 of FIG. 1 to locate a same segmenting point within different periodic segments 501a . . . 501n). A difference feature 505 and a minimum relative angle 504 feature may be determined to locate a lowest point of each periodic signal segment. The difference feature 505 is defined as a difference between lowest point (e.g., point 506a) and its previous sample point (e.g., point 506b) and the difference between the lowest point and a next sample point (e.g., point 506c). The difference feature reflects a change in amplitude of the signal 500 so the feature may distinguish different lowest points. If an amplitude of multiple lowest points comprises a same point, a relative minimum angle 504 may be determined for locating a lowest point of each periodic signal segment. A relative minimum angle refers to an angle located between a line (e.g., line 510) connecting a lowest point (e.g., point 507b) and the highest point (e.g., point 507c in one cycle) and a horizontal line 514. A relative minimum angle feature analyzes a difference and distance between a lowest point and a highest point to accurately locate a lowest point.

Figure 6:
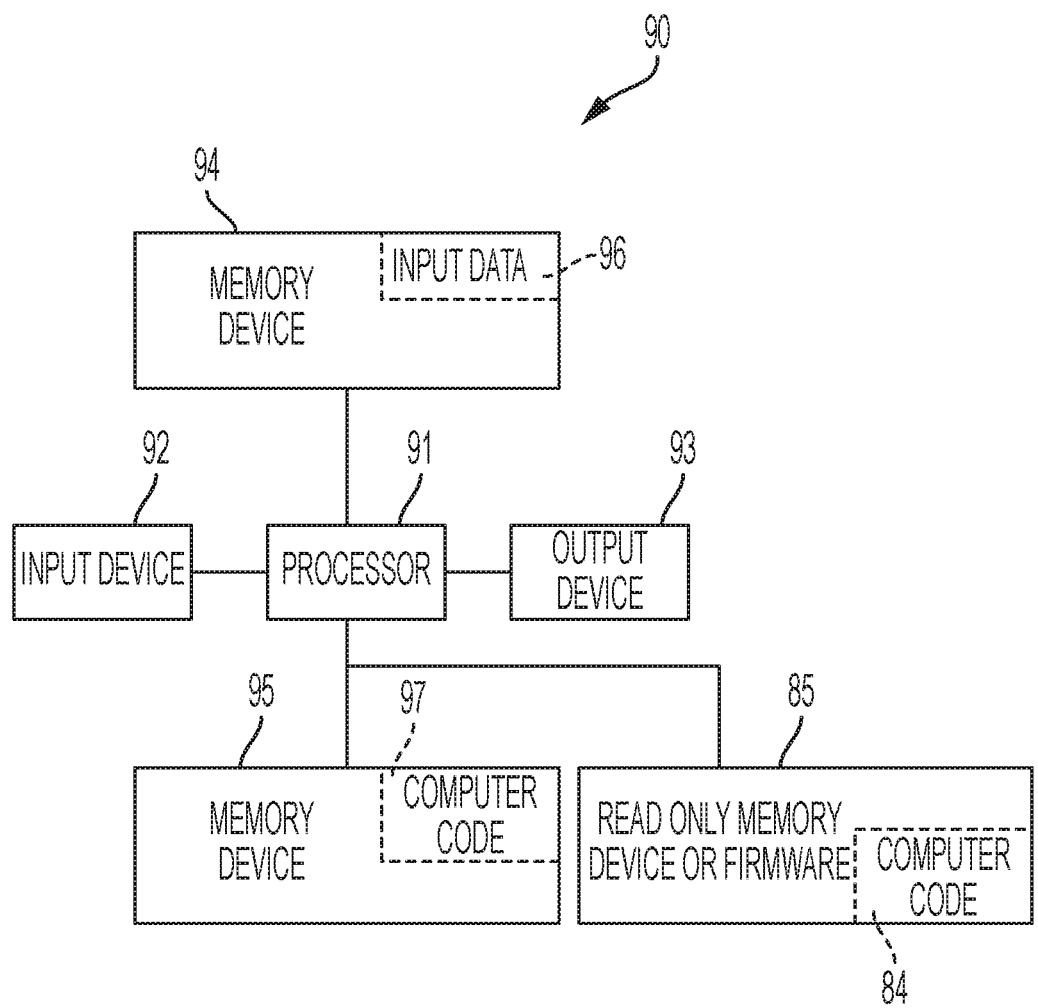
FIG. 6 illustrates a computer system used by the system of FIG. 1 for improving hardware and software technology associated with detecting, evaluating, and normalizing periodic electrical signals of an apparatus for detecting and repairing potential hardware and software issues associated with operating the apparatus, in accordance with embodiments of the present invention.

FIG. 6 illustrates a computer system 90 (e.g., hardware device 138 and/or apparatus 139 of FIG. 1) used by or comprised by the system of FIG. 1 for improving hardware and software technology associated with detecting, evaluating, and normalizing periodic electrical signals of an apparatus for detecting and repairing potential hardware and software issues associated with operating the apparatus, in accordance with embodiments of the present invention.

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module," or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing apparatus receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, device (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, a mobile device, a smart watch, or other programmable data processing device to produce a machine, such that the instructions, which execute via the processor of the computer or other programmable data processing device, create means for implementing the functions/acts specified in the flowchart and/or block diagram block or blocks. These computer readable program instructions may also be stored in a computer readable storage medium that can direct a computer, a programmable data processing device, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing device, or other device to cause a series of operational steps to be performed on the computer, other programmable device or other device to produce a computer implemented process, such that the instructions which execute on the computer, other programmable device, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The computer system 90 illustrated in FIG. 6 includes a processor 91, an input device 92 coupled to the processor 91, an output device 93 coupled to the processor 91, and memory devices 94 and 95 each coupled to the processor 91. The input device 92 may be, inter alia, a keyboard, a mouse, a camera, a touchscreen, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random-access memory (DRAM), a read-only memory (ROM), etc. The memory device 95 includes a computer code 97. The computer code 97 includes algorithms (e.g., the algorithm of FIG. 2) for improving hardware and software technology associated with detecting, evaluating, and normalizing periodic electrical signals of an apparatus for detecting and repairing potential hardware and software issues associated with operating the apparatus. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices such as Read-Only Memory (ROM) device or firmware 85) may include algorithms (e.g., the algorithm of FIG. 2) and may be used as a computer usable medium (or a computer readable medium or a program storage device) having a computer readable program code embodied therein and/or having other data stored therein, wherein the computer readable program code includes the computer code 97. Generally, a computer program product (or, alternatively, an article of manufacture) of the computer system 90 may include the computer usable medium (or the program storage device).

In some embodiments, rather than being stored and accessed from a hard drive, optical disc or other writeable, rewriteable, or removable hardware memory device 95, stored computer program code 84 (e.g., including algorithms) may be stored on a static, nonremovable, read-only storage medium such as ROM device or firmware 85, or may be accessed by processor 91 directly from such a static, nonremovable, read-only medium. Similarly, in some embodiments, stored computer program code 97 may be stored as ROM device or firmware 85, or may be accessed by processor 91 directly from such ROM device or firmware 85, rather than from a more dynamic or removable hardware data-storage device 95, such as a hard drive or optical disc.

Still yet, any of the components of the present invention could be created, integrated, hosted, maintained, deployed, managed, serviced, etc. by a service supplier who offers to improve hardware and software technology associated with detecting, evaluating, and normalizing periodic electrical signals of an apparatus for detecting and repairing potential hardware and software issues associated with operating the apparatus. Thus, the present invention discloses a process for deploying, creating, integrating, hosting, maintaining, and/or integrating computing infrastructure, including integrating computer-readable code into the computer system 90, wherein the code in combination with the computer system 90 is capable of performing a method for enabling a process for improving hardware and software technology associated with detecting, evaluating, and normalizing periodic electrical signals of an apparatus for detecting and repairing potential hardware and software issues associated with operating the apparatus. In another embodiment, the invention provides a business method that performs the process steps of the invention on a subscription, advertising, and/or fee basis. That is, a service supplier, such as a Solution Integrator, could offer to enable a process for improving hardware and software technology associated with detecting, evaluating, and normalizing periodic electrical signals of an apparatus for detecting and repairing potential hardware and software issues associated with operating the apparatus. In this case, the service supplier can create, maintain, support, etc. a computer infrastructure that performs the process steps of the invention for one or more customers. In return, the service supplier can receive payment from the customer(s) under a subscription and/or fee agreement and/or the service supplier can receive payment from the sale of advertising content to one or more third parties.

While FIG. 6 shows the computer system 90 as a configuration of hardware and software, any configuration of hardware and software, as would be known to a person of ordinary skill in the art, may be utilized for the purposes stated supra in conjunction with the computer system 90 of FIG. 6. For example, the memory devices 94 and 95 may be portions of a single memory device rather than separate memory devices.

Cloud Computing Environment

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
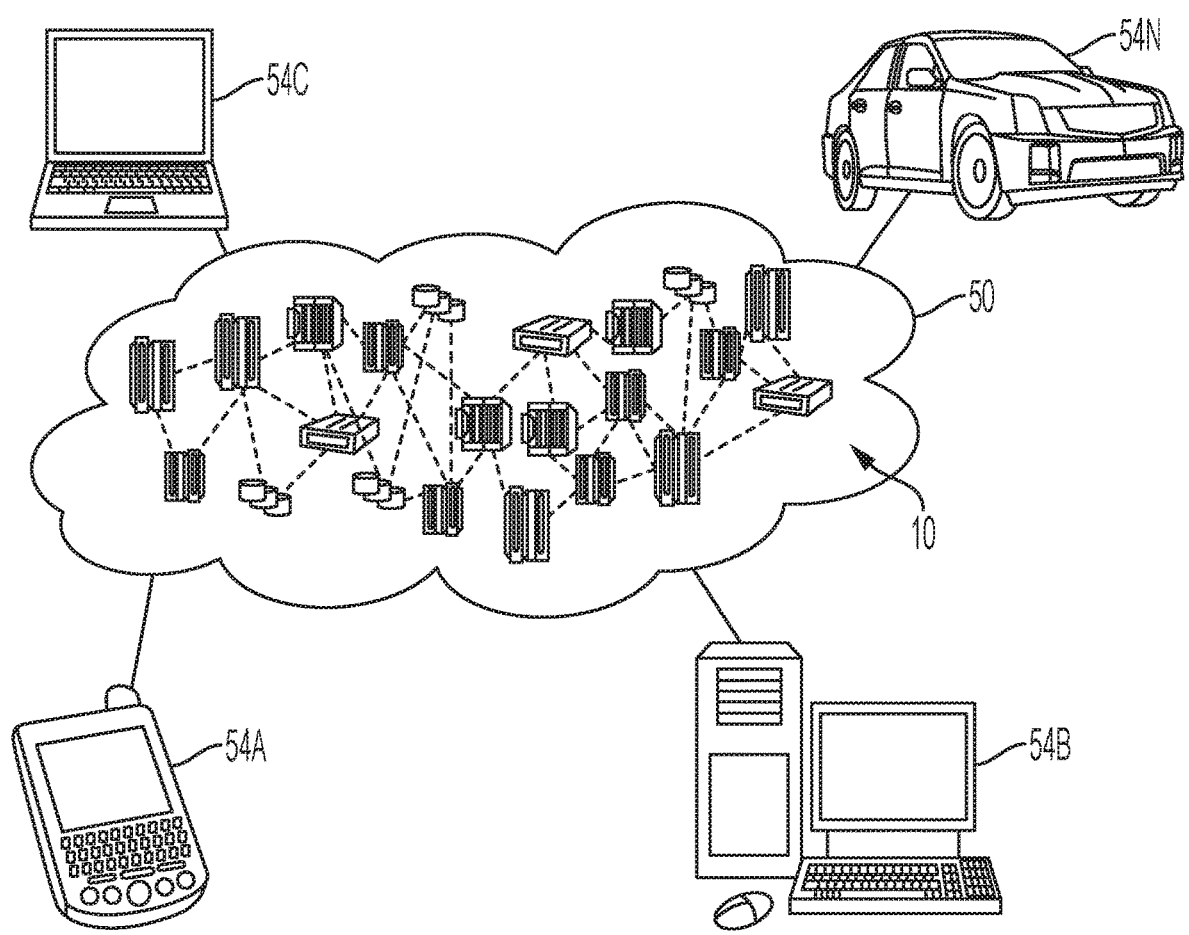
FIG. 7 illustrates a cloud computing environment, in accordance with embodiments of the present invention.

Referring now to FIG. 7, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A, 54B, 54C and 54N shown in FIG. 7 are intended to be illustrative only and that computing nodes 10 and cloud computing environment 50 can communicate with any type of computerized device over any type of network and/or network addressable connection (e.g., using a web browser).

Figure 8:
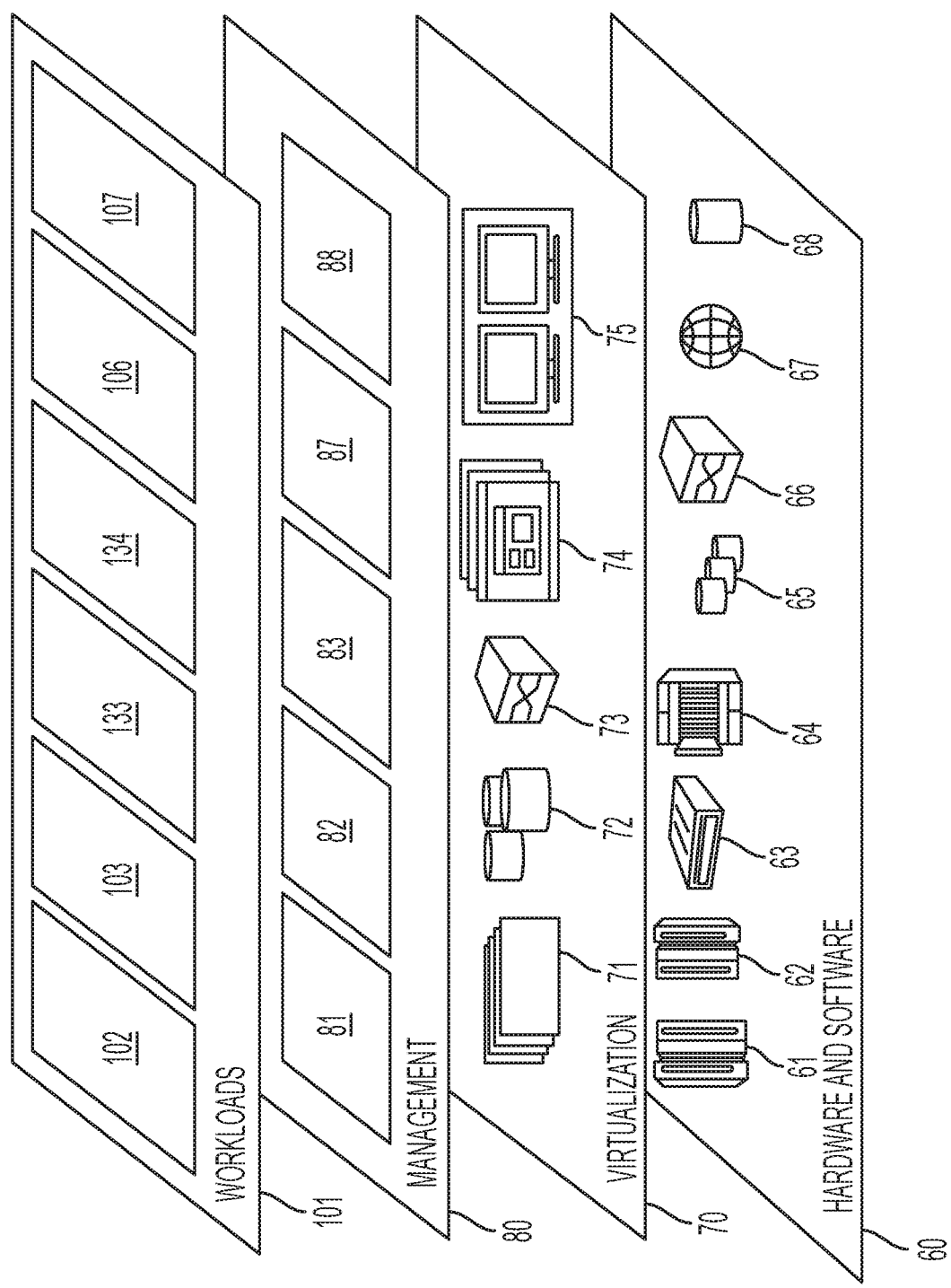
FIG. 8 illustrates a set of functional abstraction layers provided by cloud computing environment, in accordance with embodiments of the present invention.

Referring now to FIG. 8, a set of functional abstraction layers provided by cloud computing environment 50 (see FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 87 provides cloud computing resource allocation and management such that required service levels are met. Service Level Agreement (SLA) planning and fulfillment 88 provide pre-arrangement for, and procurement of, cloud computing resources for which a future requirement is anticipated in accordance with an SLA.

Workloads layer 101 provides examples of functionality for which the cloud computing environment may be utilized. Examples of workloads and functions which may be provided from this layer include: mapping and navigation 102; software development and lifecycle management 103; virtual classroom education delivery 133; data analytics processing 134; transaction processing 106; and for improving network security technology associated with monitoring network usage, ranking and modifying user security questions associated with enabling access to a secure account of a user; and detecting, evaluating, and normalizing periodic electrical signals of an apparatus for detecting and repairing potential hardware and software issues associated with operating the apparatus 107.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A signal detection and monitoring method comprising:
   detecting, by a processor of a hardware device, an alignment point for a periodic signal segment of a periodic signal generated by an apparatus being monitored for standard functionality;
   activating, by said processor in response results of said detecting, said apparatus from a period prior to said alignment point to an end point of said periodic signal segment;
   first locating, by said processor, a first point of said periodic signal segment;
   second locating, by said processor, a second point of an additional periodic signal segment of said periodic signal, wherein said first locating and said second locating comprise:
      determining a lowest point of said periodic signal segment;
      determining a difference feature between said first point of said periodic signal segment and said second point of said additional periodic signal segment;
      determining a relative minimum angle between said first point of said periodic signal segment and said second point of said additional periodic signal segment; and
      analyzing said lowest point with respect to said difference feature and said relative minimum angle;
   normalizing, by said processor in response to results of said first locating and said second locating, said periodic signal;
   further determining, by said processor based on results of said first locating and said second locating, that said apparatus is malfunctioning or requires hardware or software maintenance; and
   repairing or maintaining in response to results of said further determining, by said processor, hardware or software of said apparatus.

2. The method of claim 1, wherein said determining said difference feature comprises:
   determining a first difference between said lowest point and a previously retrieved sample point of said periodic signal segment; and
   determining a second difference between said lowest point and a next sample point of said periodic signal segment, wherein said first difference and said second difference indicate a change in amplitude of said periodic signal.

3. The method of claim 1, wherein said relative minimum angle comprises an angle located between a line connecting said lowest point and a highest point of said periodic signal segment and a horizontal line.

4. The method of claim 1, wherein said activating said apparatus comprises rotating a portion of said apparatus from said period prior to said alignment point to said end point of said periodic signal segment.

5. The method of claim 1, wherein each of said first point and said second point comprises a unique cutting point.

6. The method of claim 1, wherein each of said first point and said second point comprises a uniform alignment point.

7. The method of claim 1, further comprising:
   providing at least one support service for at least one of creating, integrating, hosting, maintaining, and deploying computer-readable code in the hardware device, said code being executed by the computer processor to implement: said detecting, said activating, said first locating, said second locating, and said normalizing.

8. A computer program product, comprising a computer readable hardware storage device storing a computer readable program code, said computer readable program code comprising an algorithm that when executed by a processor of a hardware device implements a signal detection and monitoring method, said method comprising:
   detecting, by said processor, an alignment point for a periodic signal segment of a periodic signal generated by an apparatus being monitored for standard functionality;
   activating, by said processor in response results of said detecting, said apparatus from a period prior to said alignment point to an end point of said periodic signal segment;
   first locating, by said processor, a first point of said periodic signal segment;
   second locating, by said processor, a second point of an additional periodic signal segment of said periodic signal, wherein said first locating and said second locating comprise:
      determining a lowest point of said periodic signal segment;
      determining a difference feature between said first point of said periodic signal segment and said second point of said additional periodic signal segment;
      determining a relative minimum angle between said first point of said periodic signal segment and said second point of said additional periodic signal segment; and
      analyzing said lowest point with respect to said difference feature and said relative minimum angle;
   normalizing, by said processor in response to results of said first locating and said second locating, said periodic signal;
   further determining, by said processor based on results of said first locating and said second locating, that said apparatus is malfunctioning or requires hardware or software maintenance; and
   repairing or maintaining in response to results of said further determining, by said processor, hardware or software of said apparatus.

9. The computer program product of claim 8, wherein said determining said difference feature comprises:
   determining a first difference between said lowest point and a previously retrieved sample point of said periodic signal segment; and
   determining a second difference between said lowest point and a next sample point of said periodic signal segment, wherein said first difference and said second difference indicate a change in amplitude of said periodic signal.

10. The computer program product of claim 8, wherein said relative minimum angle comprises an angle located between a line connecting said lowest point and a highest point of said periodic signal segment and a horizontal line.

11. The computer program product of claim 8, wherein said activating said apparatus comprises rotating a portion of said apparatus from said period prior to said alignment point to said end point of said periodic signal segment.

12. The computer program product of claim 8, wherein each of said first point and said second point comprises a unique cutting point.

13. The computer program product of claim 8, wherein each of said first point and said second point comprises a uniform alignment point.

14. A hardware device comprising a processor coupled to a computer-readable memory unit, said memory unit comprising instructions that when executed by the processor implements a signal detection and monitoring method comprising:

> detecting, by said processor, an alignment point for a periodic signal segment of a periodic signal generated by an apparatus being monitored for standard functionality;
>
> activating, by said processor in response results of said detecting, said apparatus from a period prior to said alignment point to an end point of said periodic signal segment;
>
> first locating, by said processor, a first point of said periodic signal segment;
>
> second locating, by said processor, a second point of an additional periodic signal segment of said periodic signal, wherein said first locating and said second locating comprise:
>
>> determining a lowest point of said periodic signal segment;
>>
>> determining a difference feature between said first point of said periodic signal segment and said second point of said additional periodic signal segment;
>>
>> determining a relative minimum angle between said first point of said periodic signal segment and said second point of said additional periodic signal segment; and
>>
>> analyzing said lowest point with respect to said difference feature and said relative minimum angle;
>
> normalizing, by said processor in response to results of said first locating and said second locating, said periodic signal;
>
> further determining, by said processor based on results of said first locating and said second locating, that said apparatus is malfunctioning or requires hardware or software maintenance; and
>
> repairing or maintaining in response to results of said further determining, by said processor, hardware or software of said apparatus.

\* \* \* \* \*